(12) United States Patent
Hu et al.

(10) Patent No.: US 7,713,825 B2
(45) Date of Patent: May 11, 2010

(54) LDMOS TRANSISTOR DOUBLE DIFFUSED REGION FORMATION PROCESS

(75) Inventors: Binghua Hu, Plano, TX (US); Sameer P. Pendharkar, Allen, TX (US); Bill A. Wofford, Dallas, TX (US); Qingfeng Wang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 165 days.

(21) Appl. No.: 11/753,789

(22) Filed: May 25, 2007

(65) Prior Publication Data

US 2008/0293206 A1 Nov. 27, 2008

(51) Int. Cl.
*H01L 21/336* (2006.01)
(52) U.S. Cl. .................. 438/279; 438/527; 438/546; 257/408; 257/E21.409
(58) Field of Classification Search ................ 257/341, 257/335; 438/305, 303, 231, 294, 217, 135, 438/306, 527
See application file for complete search history.

(56) References Cited

U.S. PATENT DOCUMENTS

| 4,422,885 | A |  | 12/1983 | Brower et al. |
| 5,191,399 | A |  | 3/1993 | Maegawa et al. |
| 5,272,367 | A |  | 12/1993 | Dennison et al. |
| 5,719,421 | A | * | 2/1998 | Hutter et al. ................. 257/335 |
| 6,437,397 | B1 |  | 8/2002 | Lin et al. |
| 2004/0079974 | A1 | * | 4/2004 | Lin et al. ..................... 257/288 |
| 2004/0106236 | A1 | * | 6/2004 | Hu et al. ...................... 438/135 |
| 2005/0118535 | A1 | * | 6/2005 | Kawano et al. ............. 430/330 |
| 2006/0249767 | A1 | * | 11/2006 | Rhodes ......................... 257/292 |
| 2006/0270096 | A1 | * | 11/2006 | Brady et al. ................... 438/73 |
| 2007/0037368 | A1 | * | 2/2007 | Kim ........................... 438/542 |

* cited by examiner

*Primary Examiner*—Evan Pert
*Assistant Examiner*—Andres Munoz
(74) *Attorney, Agent, or Firm*—Warren L. Franz; Wade J. Brady, III; Frederick J. Telecky, Jr.

(57) ABSTRACT

Exemplary embodiments provide manufacturing methods for forming a doped region in a semiconductor. Specifically, the doped region can be formed by multiple ion implantation processes using a patterned photoresist (PR) layer as a mask. The patterned PR layer can be formed using a hard-bakeless photolithography process by removing a hard-bake step to improve the profile of the patterned PR layer. The multiple ion implantation processes can be performed in a sequence of, implanting a first dopant species using a high energy; implanting the first dopant species using a reduced energy and an increased implant angle (e.g., about 9° or higher); and implanting a second dopant species using a reduced energy. In various embodiments, the doped region can be used as a double diffused region for LDMOS transistors.

13 Claims, 5 Drawing Sheets

LDMOS TRANSISTOR DOUBLE DIFFUSED REGION FORMATION PROCESS

FIELD OF THE INVENTION

This invention generally relates to semiconductor devices and methods for their manufacture, and, more particularly, to lateral double diffused metal oxide semiconductor (LDMOS) transistors and methods for their manufacture.

BACKGROUND OF THE INVENTION

Lateral double-diffused metal oxide semiconductor (LDMOS) transistors require that the LDMOS transistors have a low on resistance, a high off resistance, and a large electrical safe operating area. To increase the current handling capability of the LDMOS transistors on an integrated circuit, a number of LDMOS transistors are often tied together forming, for example, multi-fingered LDMOS. With the LDMOS transistors connected in parallel, the current flow can be shared among the various LDMOS transistors. To ensure the proper distribution of current among the various LDMOS transistors, it is important that the threshold voltage (Vt) of the individual LDMOS transistor structures be closely matched.

The threshold voltage (Vt) of the LDMOS transistor is set by the multiple ion implantation processes used to form the transistor channel region. During the multiple ion implantation processes, a patterned photoresist (PR) masking layer is formed over the substrate and the dopant species are implanted through patterned openings formed in the PR masking layer. In forming the LDMOS transistors required for high current applications, a major limitation to obtaining closely matched threshold voltages is the variation in the photoresist sidewall angle of the various openings through which the dopants are implanted. For example, the photoresist sidewall angle is significantly decreased depending on local resist density, such as after the photoresist hard bake step of a conventional photolithography process.

Thus, there is a need to overcome these and other problems of the prior art and to provide methods for forming LDMOS transistors with closely matched threshold voltages.

SUMMARY OF THE INVENTION

According to various embodiments, the present teachings include a method for forming a doped region in a semiconductor. In the method, a hard-bakeless photolithography process can be used to form a photoresist (PR) layer over a semiconductor with the PR layer patterned to have at least one opening. Through each opening of the PR layer, a first dopant species can be implanted into the semiconductor to sequentially form a first doped region, and a second doped region, which is shallower than the first doped region. Through each opening of the PR layer, the second dopant species can further be implanted into the semiconductor to form a third doped region.

According to various embodiments, the present teachings also include a method of forming a double diffused region. First, a hard-bakeless photolithography process can be used to form a photoresist (PR) layer over a semiconductor having at least one opening in the PR layer. Through each opening of the PR layer, a first doped region can be formed by implanting a boron-containing species into a region of the semiconductor in a high energy tool; a second doped region that is shallower than the first doped region can be formed by implanting a boron-containing species into the semiconductor region in a reduced energy tool; and a third doped region can be formed by implanting an arsenic-containing species into the semiconductor region in a reduced energy tool. The semiconductor can then be thermally annealed.

According to various embodiments, the present teachings further include a method for forming a LDMOS transistor. In this method, a deep n-well region can be formed in an epitaxial layer on a semiconductor substrate. A patterned PR layer with at least one opening can then be formed over the deep n-well region using a hard-bakeless photolithography process. Through each opening of the patterned PR layer, first, a boron species can be implanted into the deep n-well region at a high energy; second, the boron species can be implanted into the deep n-well region at a reduced energy and with an implant angle of about 9° or higher; and, third, an arsenic species can be implanted into the deep n-well region at a reduced energy. A plurality of isolation structures can then be formed in the deep n-well region followed by the formation of a gate dielectric layer on the deep n-well region.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Figure 1:
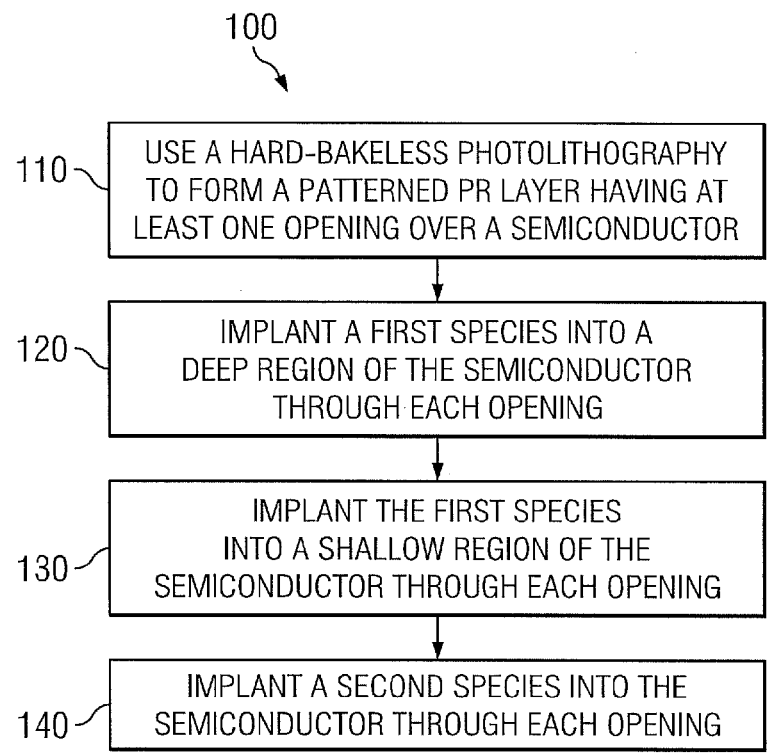
FIG. 1 depicts an exemplary method for forming a doped region in a semiconductor in accordance with the present teachings.

Reference will now be made in detail to the present embodiments (exemplary embodiments) of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Exemplary embodiments provide manufacturing methods for forming a doped region in a semiconductor. Specifically, the doped region can be formed by multiple ion implantation processes using a patterned photoresist (PR) layer as a mask. The patterned PR layer can be formed using a hard-bakeless photolithography process by removing a hard-bake step to improve the profile of the patterned PR layer (i.e., PR profile). The multiple ion implantation processes can be performed in a sequence of, for example, forming a first doped region having a first conductivity using a high energy; forming a second doped region having a first conductivity using a reduced energy; and forming a third doped region having a second conductivity using a reduced energy. In addition, during the implantation of the second doped region (having a first conductivity), the ion implant angle, for example, a boron implant angle, can be increased, e.g., about 9° or higher, to make the implantation processes less sensitive to the PR profile. In various embodiments, the doped region can be, for example, a double diffused region used in transistor devices such as LDMOS transistors.

As used herein, the term "hard-bakeless photolithography process" refers to a photolithography process that removes the hard-bake step from a conventional photolithography process. In general, a conventional photolithography process can include, for example, forming a PR layer on a substrate such as a wafer, soft-baking the PR coated wafer to drive off excess solvent, exposing the PR layer using a pattern of intense light, developing the PR layer and removing some of the PR by, for example, a chemical solution, and hard-baking the resulting wafer to solidify the remaining PR and to make a more durable protecting layer for such as future ion implantation, wet chemical etching and/or plasma etching. By removing the photoresist hard-bake step, i.e., using the "hard-bakeless photolithography process", the patterned PR layer can be formed having a sidewall angle of, for example, about 85° to about 90°, such that lot-to-lot, wafer-to-wafer and across wafer Vt variation of resulting transistor devices can be avoided.

The hard-bakeless photolithography process with the hard-bake step removed can be combined with the multiple ion implantation processes to form the disclosed doped region. The multiple ion implantation process can be performed in the sequence of, for example, high energy ion implantation for the first doped region; low energy ion implantation having an increased ion implant angle for the second doped region; and low energy ion implantation for the third doped region. This is because the PR hard bake is not necessary for the high energy implantation of the first region. But this high energy can facilitate the patterned PR layer to be cured to a certain extent to reduce out gassing of the PR layer during the subsequent implantations, where the high-energy cured patterned PR layer can be used as an implantation mask. In the subsequent shallow (second) region implantation, the increased ion implant angle, for example, about 9° or higher, can be used to compensate the implant tail from the previous high energy implantation and/or to decrease the Vt sensitivity to the profile of the patterned PR layer and thus to control Vt and Vt variations of the resulting transistor devices.

FIG. 1 depicts an exemplary method 100 for forming a doped region in a semiconductor in accordance with the present teachings. More specifically, the doped region can be formed in the semiconductor using multiple ion implantation processes through a patterned PR layer formed by the hard-bakeless photolithography process.

At 110, a patterned photoresist (PR) layer can be formed on a semiconductor. The patterned PR layer can include one or more openings, through which various dopant species can be implanted into desired regions, for example, a doped deep well (Dwell) region for LDMOS devices, of the underlying semiconductor. In an exemplary embodiment where the patterned PR layer has a single opening, the resulting semiconductor device can be used to form a single-fingered LDMOS transistor. In another exemplary embodiment where the patterned PR layer has multiple openings with each opening formed on one of the doped regions, the resulting semiconductor device can be used to form a multi-fingered LDMOS transistor. In various embodiments, a LDMOS transistor can include both single-fingers and multi-fingers.

The patterned PR layer can be formed using, for example, the hard-bakeless photolithography process. The patterned PR layer can have a thickness of, for example, on the order of about 1.8 µm to about 4 µm, in order to effectively mask the dopant species that can be subsequently implanted into the underlying semiconductor. In an exemplary embodiment, the patterned PR layer can be about 2 µm to about 3 µm thick, for example, about 2.5 µm. In various embodiments, an oxide layer can be formed between the patterned PR layer and the semiconductor.

At 120, a first ion implantation of a first dopant species can be performed through each opening of the patterned PR layer and into the doped Dwell region of the semiconductor. The first dopant species can include, for example, a boron-containing species or any other light mass implant species including, for example, elements in the periodic table below the element silicon. The first ion implantation of the first dopant species can be performed using a high energy, for example, using energies on an order of several hundreds of KeV for the first region. For example, a 1-3 µm deep boron implantation into a silicon can require an acceleration energy of approximately 300-600 KeV. The boron ions can be accelerated through the semiconductor until these ions lose energy and become implanted.

In various embodiments, the first ion implantation of the first dopant species (e.g., boron) can form a first region in the doped Dwell region having a first conductivity type, which can be opposite to the conductivity type of the doped Dwell region. For example, the first region can be a P-type region formed in an N-type Dwell region. In various embodiments, the use of P and N type semiconductor regions can be reversed for the resulting semiconductor structures/devices. For example, the first region can be an N-type semiconductor region and the doped Dwell region can be a P-type semiconductor region, and vice versa.

At 130, a second ion implantation of the first dopant species can be performed through each opening of the patterned PR layer and into the doped Dwell region of the semiconductor. A second region that is shallower than the first region can then be formed in the doped Dwell region. The second region can be implanted at a reduced energy and in a different implant tool as compared with the implantation for the fist region, yet have the same conductivity as to that of the first region in the doped Dwell region. For example, the second region can be formed by implanting a boron-containing species in a mid-current tool.

In various embodiments, the exemplary shallow boron implantation can include an increased implant angle, for example, about 9° or higher as compared with a general implant angle for such as about 2° in the art. The higher shallow implant angle as disclosed herein can compensate the implant tail from the previous high energy boron implantation. As a result, the higher shallow implant angle can provide the resulting semiconductor transistor (e.g., a LDMOS) with a higher threshold voltage and with less sensitivity to the profile of the patterned PR layer.

At 140, a third region can be formed by implanting a second dopant species through each opening of the patterned PR layer and into the doped Dwell region of the semiconductor. The second dopant species can include, for example, an arsenic-containing species or any other heavy mass implant species including, for example, elements in the periodic table above the element silicon. In various embodiments, the third region can have a second conductivity type opposite to that of both the first and the second regions in the doped Dwell region. For example, the third region can be an N-type region and the first or the second region can be a P-type region formed in an N-type Dwell region.

FIGS. 2A-2F depict an exemplary LDMOS device having a doped region fabricated using the method 100 described in FIG. 1 in accordance with the present teachings. Specifically, FIGS. 2A-2F show cross-sectional views for the exemplary LDMOS device at various stages of fabrication. It should be readily apparent to one of ordinary skill in the art that the LDMOS device depicted in FIGS. 2A-2F represents a generalized schematic illustration and that other regions/wells/layers can be added or existing regions/wells/layers can be removed or modified.

Figure 2A:
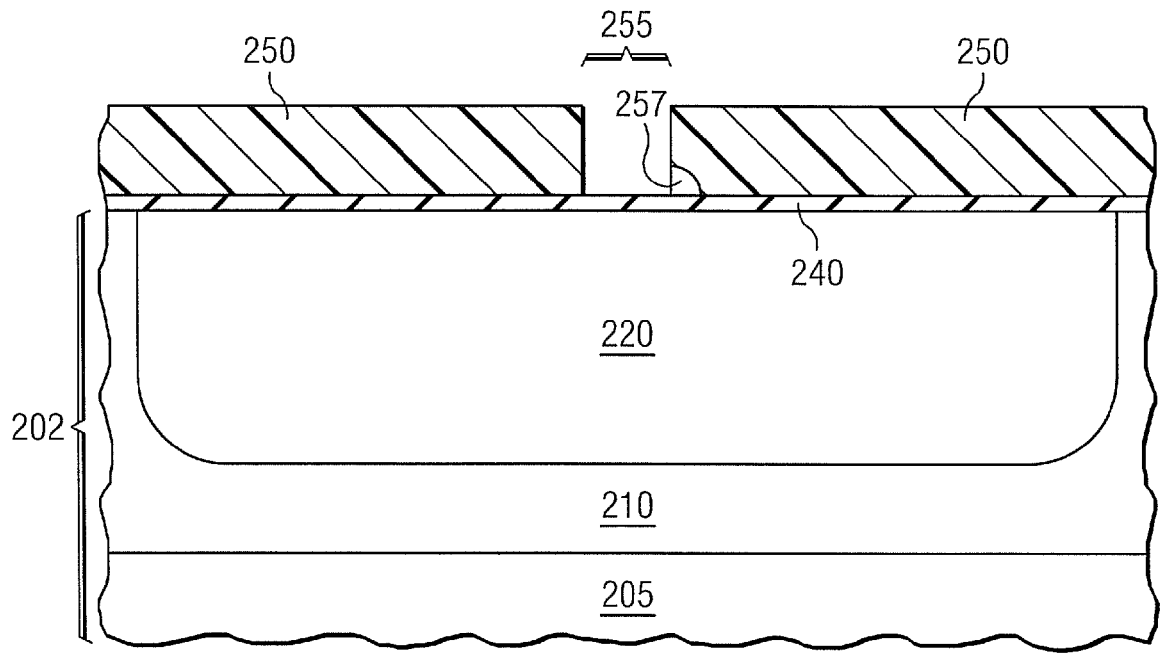
FIGS. 2A-2F depict an exemplary LDMOS device at various stages of fabrication using the method described in FIG. 1 in accordance with the present teachings.

In FIG. 2A, the exemplary LDMOS device can include a semiconductor 202 including a substrate 205 and an epitaxial layer 210 having a doped Dwell 220, an pad oxide layer 240, and a patterned PR layer 250 having an opening 255. As shown, the LDMOS device can provide a layered structure having the patterned PR layer 250 formed over the pad oxide layer 240 over the semiconductor 202 (i.e., the epitaxial layer 210 on the substrate 205).

The semiconductor 202 can include the epitaxial layer 210 formed on a substrate 205 using known semiconductor manufacturing methods. It should be noted that the formation of an epitaxial layer (e.g., 210) on a semiconductor substrate (e.g., 205) can be optional, and the method 100 can be used to form the exemplary LDMOS device on any suitable semiconductor substrate (e.g., 205) without the epitaxial layer (e.g., 210). In other words, the semiconductor 202 can be a semiconductor substrate (e.g., 205) that includes a doped Dwell (e.g., 220) in accordance with various embodiments.

The doped Dwell 220 can be formed inside the semiconductor 202, for example, inside the epitaxial layer 210 or inside the substrate 205 if there is no epitaxial layer involved. The doped Dwell 220 can be formed after the formation of the overlaid pad oxide layer 240 on the semiconductor 202. In various embodiments, the doped Dwell 220 can be formed having an opposite conductivity to, for example, the epitaxial layer 210. In an exemplary embodiment where the epitaxial layer 210 is P-type, the doped Dwell 220 can be N-type. Similarly, an N-type epitaxial layer 210 can require the formation of a P-type Dwell 220.

The pad oxide layer 240 can be formed on the semiconductor 202 following the formation of the epitaxial layer 210 and prior to the formation of the doped Dwell 220. In various embodiments, the pad oxide layer 240 can be used to reduce the damage caused by the subsequent implantation processes.

The patterned PR layer 250 can be formed over the pad oxide layer 240 after the formation of the doped Dwell 220. The patterned PR layer 250 can be formed using the hard-bakeless photolithography process with a thickness of about 1.8 μm to about 4 μm. In an additional example, the thickness of the patterned PR layer 250 can be about 2 μm to about 3 μm, such us, about 2.5 μm.

The patterned PR layer 250 can include a single opening 255 as illustrated in FIG. 2A, which can be used to form a single-fingered LDMOS transistor. However, the semiconductor devices and the methods for their manufacturing should not be limited to PR layers having a single opening. For example, if a multi-fingered LDMOS transistor is required, the doped Dwell 220 (e.g., a deep n-well) and the patterned PR layer 250 illustrated in FIG. 2A can be repeated multiple times along a line in the epitaxial layer 210 of the semiconductor 202.

Still referring to FIG. 2A, the patterned PR layer 250 can further include a sidewall angle 257 (also referred herein as "PR profile angle" or "PR profile sidewall angle"), which is an angle made by an edge of the patterned PR layer 250 that is adjacent to the opening 255 with the surface of the underlying layer, for example, the pad oxide layer 240. In a conventional photolithography process that includes a hard-bake step for forming the patterned PR layer, the sidewall of the PR layer 250 can be pulled back after the hard-bake and thus the sidewall angle 257 can be reduced. This reduction can lead to penetration of high-energy boron species into masked regions of the doped deep region beneath the patterned PR layer. Further, because the change of angles can be different across the different fingers, for example, for multi-fingered LDMOS transistors, large variations in LDMOS threshold voltages Vt can result. By using the disclosed hard-bakeless photolithography process to form the patterned PR layer 250, such Vt delta (i.e., variations of LDMOS Vt) can be avoided. In various embodiments, the PR sidewall angle 257 can be in a range of about 85° to about 90°. Table 1 depicts Vt delta of exemplary LDMOS devices formed using the hard-bakeless photolithography process (i.e., with PR hard-bake step removed) as compared to that using a conventional photolithography process with PR hard-bake step involved.

TABLE 1

| | Device | Median (Q2) |
|---|---|---|
| Hard-bakeless photolithography (i.e., PR hard-bake step removed) | D45H_VTL | 0.994 |
| | D45HMVTL | 0.947 |
| | Vt delta | 0.047 |
| Conventional photolithography (i.e., PR hard-bake step involved) | D45H_VTL | 1.267 |
| | D45HMVTL | 1.064 |
| | Vt delta | 0.204 |

In this example, the Vt delta can be a threshold voltage difference between a single-finger and a double-finger of each of the exemplary LDMOS devices (i.e., D45H_VTL, D45HMVTL, D45H_VTL, and D45HMVTL). As shown in Table 1, the threshold voltage difference (i.e., Vt delta) for each device fabricated by the hard-bakeless photolithography process can be about 0.047 V, which is reduced for more than about 4 times as compared with each LDMOS device fabricated by the conventional photolithography process having an exemplary Vt delta of about 0.204 V. Because of the use of the hard-bakeless photolithography process, the threshold voltage mismatches can be significantly reduced. For each device listed in table 1, the exemplary shallow boron implant angle is about 2 degree and a plurality of data, for example, about 18 data or more, are taken for the purpose of statistic comparison.

Figure 2B:
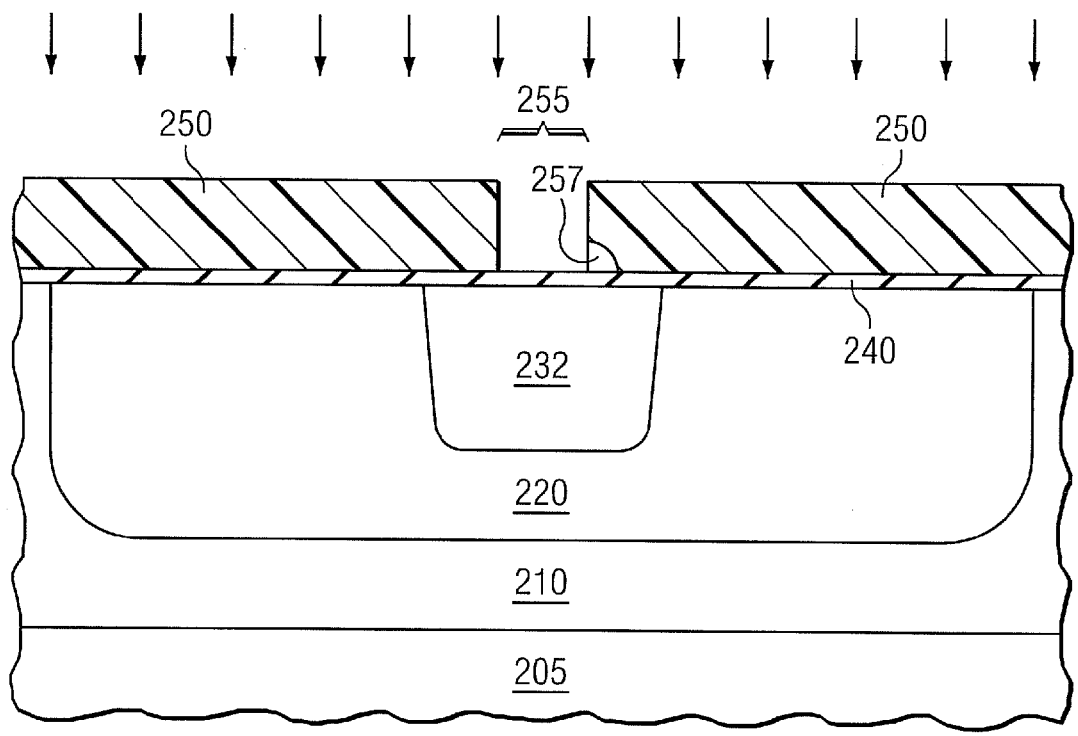

Referring to FIG. 2B, the exemplary LDMOS device can further include a first doped region 232 formed in the doped Dwell 220 through the opening 255 of the patterned PR layer 250. The first doped region 232 can be doped using a high energy, for example, on the order of several hundreds KeV in a MeV tool. In various embodiment, the high energy implantation can be performed by implanting a boron-containing species or other light species at energies of, for example, about 300 KeV to about 600 KeV, and doses of, for example, about $1 \times 10^{12}$ cm$^{-2}$ to about $1 \times 10^{14}$ cm$^{-2}$. In an exemplary embodiment, the high energy boron ion implantation of the first doped region 232 can be performed at an energy of about 0.375 MeV and a dose of about $2 \times 10^{13}$ cm$^{-2}$ in a MeV tool. In various embodiments, the first doped region 232 in the doped Dwell 220 can have opposite conductivities with one another. For example, when the doped Dwell 220 is an N-type Dwell, the first doped region 232 can be a P-type doped with the exemplary boron-containing-species. On the other hand, the first doped region 232 can be doped with, for example, arsenic-containing-species having an N-type conductivity in a P-type Dwell 220.

Figure 2C:
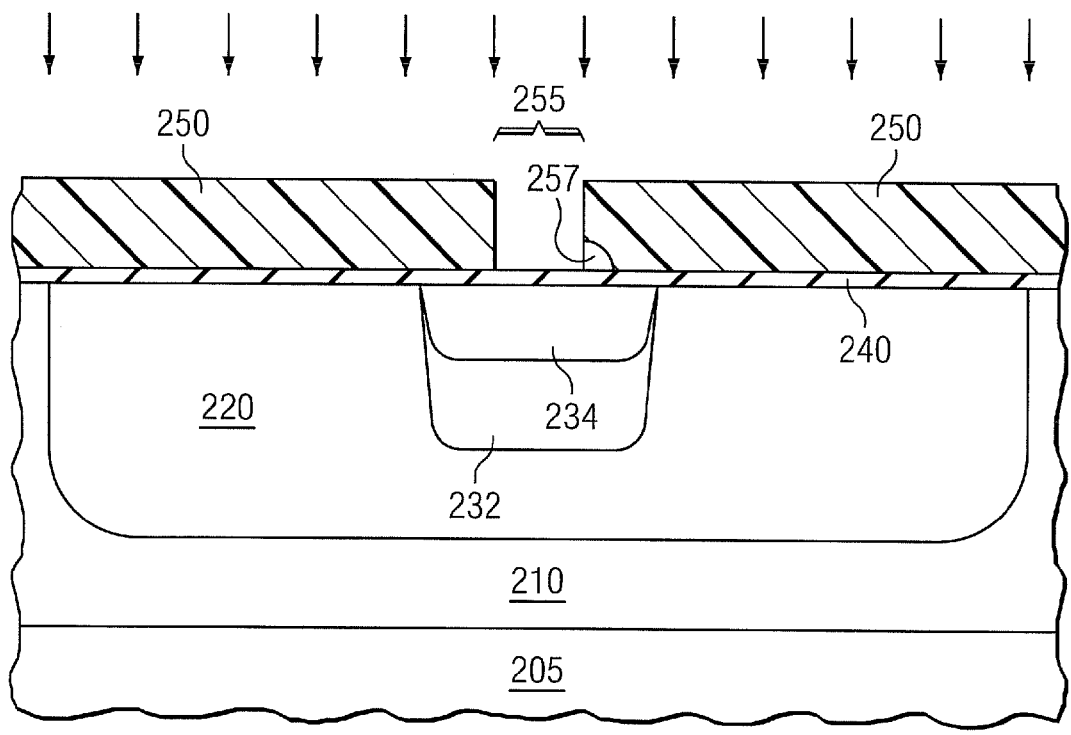

In FIG. 2C, following the formation of the first doped region 232 in the doped Dwell 220, the exemplary LDMOS device can further include a second doped region 234, i.e., a shallow doped region, formed using the patterned PR layer 250 as a mask. The second (shallow) doped region 234 can have the same conductivity as that of the first doped region 232. For example, the second (shallow) doped region 234 can be doped with boron-containing species or other light dopants to provide a P-type region, when the first doped region 232 is a P-type region. The second doped region 234 can be doped by, for example, an ion implantation process, using, for example, a reduced energy, such as, about 20 KeV to about 200 KeV in a mid-current tool. The second doped region 234 can also be doped with an exemplary dose of about $1 \times 10^{13}$ cm$^{-2}$ to about $5 \times 10^{14}$ cm$^{-2}$.

Figure 3A:
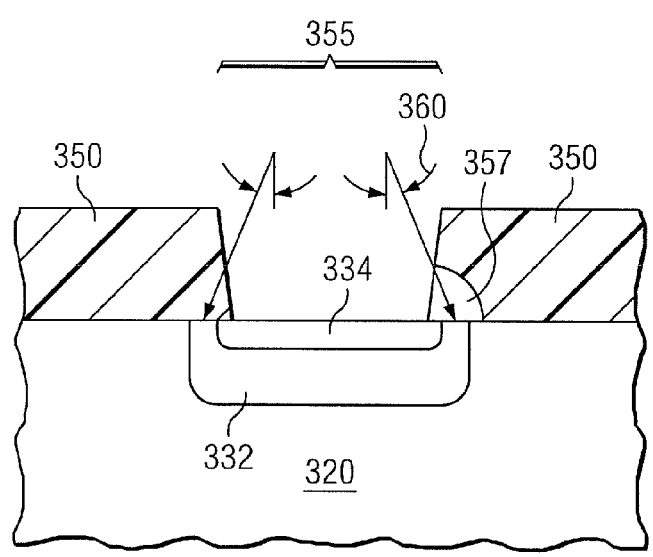
FIG. 3A is a schematic showing an exemplary shallow ion implant angle for forming the second doped region in accordance with the present teachings.

In an exemplary embodiment, the ion implantation process of the second doped region 234 using a low energy and a high ion dosage can dominantly facilitate to set the threshold voltage (Vt) of the resulting LDMOS transistor. In various embodiments, the exemplary shallow ion (e.g., boron) implantation can be performed with a desired implant angle, such as, for example, about 9° or higher. FIG. 3A is a schematic showing an exemplary shallow ion implant angle 360 for forming a second doped region 334 in a Dwell 320 through an opening 355 of a patterned PR layer 350 in accordance with the present teachings. The PR profile can be determined by the sidewall angle 357, which is defined by the edge of the patterned PR layer 350 and the opening 355 making with the surface of the underlying layer 340.

Figure 3B:
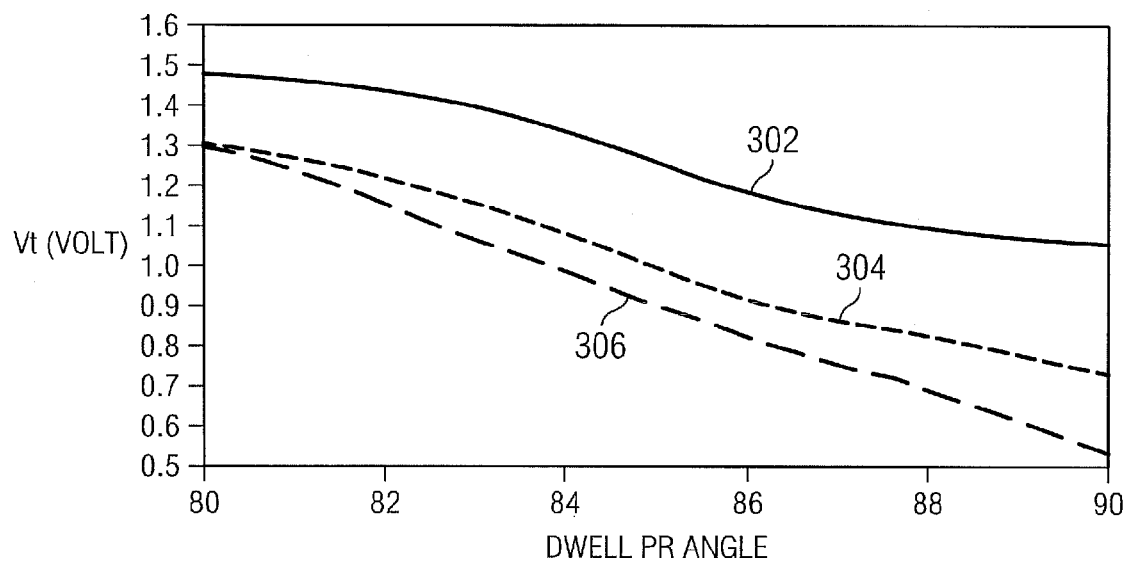
FIG. 3B depicts exemplary results showing the effect of the shallow boron implant angle on the threshold voltage (Vt) dependence upon the PR profile in accordance with the present teachings.

Various shallow boron implant angles 360 can be used. FIG. 3B depicts exemplary results showing the effect of the shallow boron implant angle on the threshold voltage (Vt) dependence upon the PR profile in accordance with the present teachings. As shown, FIG. 3B includes curves 302, 304, and 306 for a shallow boron implant angle (e.g., 360) of about 2°, 9° and 20°, respectively. As indicated, the resulting threshold voltage Vt for the 20° implant angle (see the curve 306) is greater than that for the 9° implant angle (see the curve 304), which is greater than that for the 2° implant angle (see the curve 302). That is, a higher titled shallow boron implant angle 360 can result a higher Vt. It is also noted that, when the PR profile sidewall angle 357 is higher than 86°, the higher titled shallow boron implant angle 360 can decrease the Vt sensitivity to Dwell PR profile. This solves the problem in the prior art that the Vt of LDMOS devices strongly depends on the Dwell PR profile if the PR sidewall angle is above 80°.

Figure 4:
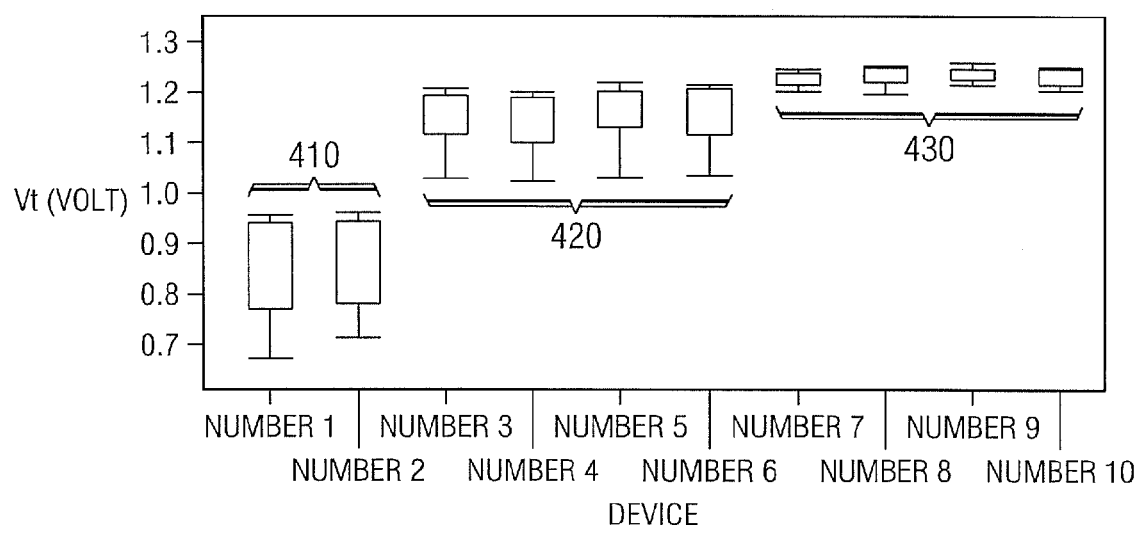
FIG. 4 depicts an exemplary result showing an effect of shallow boron implant angle on the across-wafer Vt variations for LDMOS devices in accordance with the present teachings.

Furthermore, when an increased shallow boron implant angle 360 (e.g., about 9° or higher) is used, the across-wafer Vt variations of the resulting LDMOS devices can also be improved significantly. FIG. 4 depicts an exemplary result showing the effect of shallow boron implant angles (e.g., 360 in FIG. 3A) on the across-wafer Vt variations for LDMOS devices in accordance with the present teachings. Specifically, FIG. 4 includes three sets of devices shown as 410, 420 and 430 formed using various shallow boron implant angles (e.g., 360 in FIG. 3A) of about 2°, 9°, and 12°, respectively. As shown, when the shallow boron implant angle is increased, for example, from about 2° to about 12°, the across-wafer Vt variations for LDMOS devices can be decreased and thus Vt mismatches between, for example, single-fingered LDMOS and multi-fingered LDMOS can be decreased.

Figure 2D:
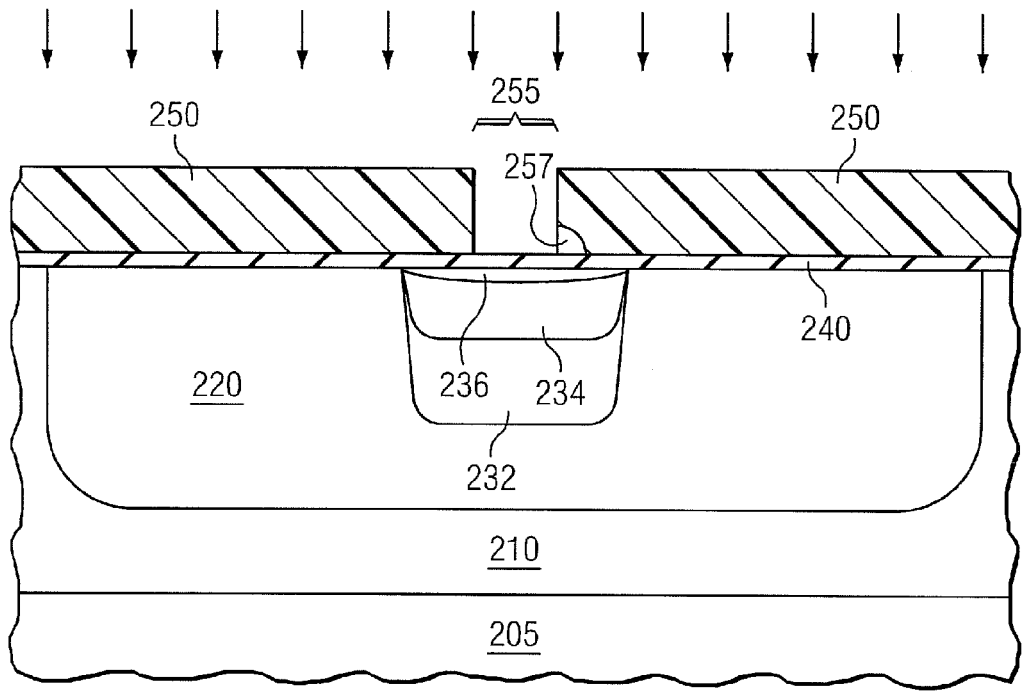

Referring to FIG. 2D, following the formation of the second doped region 234 in the doped Dwell 220, the exemplary LDMOS device can further include a third doped region 236 formed through the opening 255 using the patterned PR layer 250 as a mask. The third doped region 236 can have an opposite conductivity as to that of both the first and the second doped regions 232 and 234. For example, the third doped region 236 can be doped with arsenic-containing species or other heavy dopants to provide an N-type region, when the first and the second doped regions 232 and 234 are P-type regions. The third doped region 236 can be doped by, for example, an ion implantation process, using an exemplary energy at about 120 KeV to about 200 Kev in a mid-current tool and an exemplary dose at about $1 \times 10^{13}$ cm$^{-2}$ to about $2 \times 10^{14}$ cm$^{-2}$.

Figure 2E:
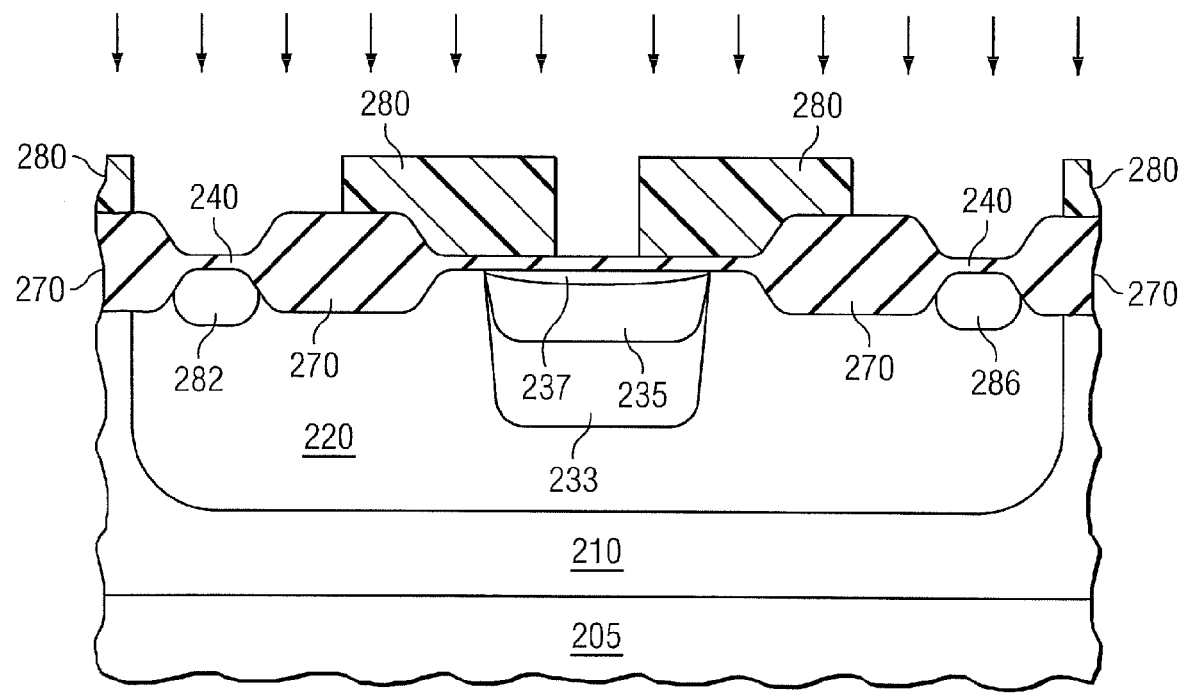

In FIG. 2E, the exemplary LDMOS device can be completed using technologies and methods known to one of the ordinary skill in the art. For example, the LDMOS device can further include isolation regions 270, double defused regions 233, 235, and 237, a second patterned PR (PR) layer 280 and the regions 282 and 286.

The isolation regions 270 can be formed following the multiple ion implantation processes as described in FIGS. 2B-2D. However, one of ordinary skill in the art will understand that the isolation regions 270 can be formed in the doped Dwell region 220 (see FIG. 2A) prior to the multiple ion implantation processes described in FIGS. 2B-2D. In various embodiments, the isolation regions 270 can be formed using known isolation structures, such as, for example, local oxide isolation structures (LOCOS) or STI (shallow trench isolation) structures.

The double defused regions 233, 235, and 237 can then be formed following the formation of the isolation regions 270. In various embodiments, the double defused regions 233, 235, and 237 can be formed prior to the formation of the isolation regions 270 that includes the LOCOS structures or the STI structures.

In an exemplary embodiment where LOCOS structures (see FIG. 2E) are used for the isolation regions 270, the LOCOS can be formed by first removing patterned PR layer 250 or any addition processes, and then forming, for example, patterned silicon nitride layers (not shown) on the pad oxide 240. The patterned silicon nitride layers can be formed in those areas where no LOCOS isolation structures 270 are desired. Following the formation of the patterned silicon nitride layers, the LOCOS structures 270 can be formed using, for example, thermal oxidation. During the exemplary LOCOS thermal oxidation process, the patterned silicon nitride layers can block the oxidation process in the regions of the epitaxial layer 210 that underlies the layers. The thermal oxidation process used to form the LOCOS structures 270 can take place at temperatures, for example, above 800° C.

In various embodiments, this LOCOS thermal oxidation process can be used as a thermal annealing process to form the double diffused regions 233, 235, and 237 by diffusing the implanted exemplary boron and arsenic species. Generally, the boron species have a temperature dependent intrinsic diffusivity constant that is almost an order of magnitude greater than that of the arsenic species. The lateral diffusion of the boron species (e.g., in the first and the second doped regions 232 and 234) that occurs during the LOCOS thermal oxidation process can therefore be greater than that of the arsenic species (e.g., in the third doped region 236). The difference in lateral diffusion of the boron and arsenic species can result in the formation of the double diffused regions 233, 235, and 237. In some embodiments, the double diffused regions 233, 235 and 237 can be formed prior to the formation of the LOCOS isolation regions by, for example, an independent thermal annealing process having a temperature of, for example, about 800° C. or higher.

In another exemplary embodiment where STI structures (not shown) are used for the isolation regions 270, the double diffused regions 233, 235, and 237 can be formed after the formation of the STI isolation regions by, for example, an independent thermal annealing cycle (or cycles), using a temperature of, for example, about 800° C. to about 1200° C. Alternatively, the double diffused regions 233, 235, and 237 can be formed prior to the formation of the STI insolation regions (not shown) by the exemplary independent thermal annealing cycle (or cycles) at a temperature of about 800° C. to about 1200° C.

In this manner, the diffused region 237, for example, an N-type diffused region in the final LDMOS device, can be used as the source of the transistor. And the inversion channel of the transistor can be formed in the exemplary P-type diffused regions 233 and 235.

The second patterned PR layer 280 can be formed after the formation of the isolation structures 270 and the double diffused regions 233, 235 and 237. The second patterned PR layer 280 can be used as an ion implantation mask for the subsequent ion implantation process.

The regions 282 and 286 can function as the drain regions of the resulting LDMOS transistor and can be, for example, N-type regions. Suitable N-type dopant species can be implanted use the second patterned PR layer 280 as an ion implantation mask. During this implantation process, N-type dopant species can also be implanted into the source region 237 to further increase the n-doping concentration.

Figure 2F:
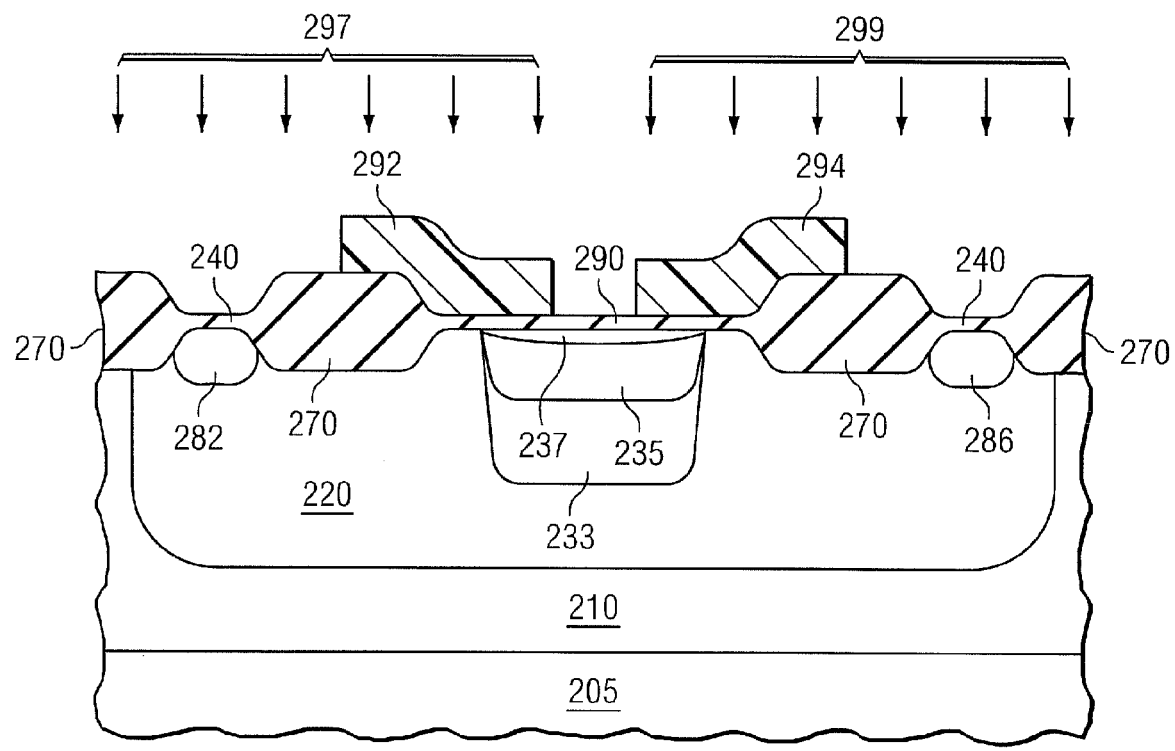

In FIG. 2F, the exemplary LDMOS device can further include a gate dielectric layer 290, and doped polysilicon structures 292 and 294 to form LDMOS transistors 297 and 299. The gate dielectric layer 290 can be formed above the double diffused regions 233, 235, and 237. The gate dielectric layer 290 can include a material selected from the group consisting of silicon oxide, nitrogen-containing silicon oxide, and silicon nitrogen. The doped polysilicon structures 292 and 294 can be formed using known processing methods and function as the gate electrodes for the LDMOS transistors 297 and 299, respectively. The LDMOS transistors 297 and 299 can share a common source region 237. The LDMOS transistor 297 can also include the gate electrode region 292 and the drain region 290. Similarly, in addition to the common source region 237 the LDMOS transistor 299 can also include the gate electrode 296 and the drain region 295.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for forming a double diffused region of a laterally diffused metal oxide semiconductor (LDMOS) transistor, comprising:
    forming a patterned photoresist layer over a semiconductor substrate without hard baking;
    forming a first doped region by implanting a first boron-containing species into a region of the semiconductor substrate through the non-hard baked patterned photoresist layer at an implant energy of 300 KeV or greater in a high energy tool;
    following forming the first doped region, forming a second doped region by implanting a second boron-containing species into the semiconductor substrate region through the non-hard baked patterned photoresist layer at an implant energy of 200 KeV or less in a reduced energy tool; wherein the second doped region is shallower than the first doped region and wherein the energy used to form the first doped region functions to cure the non-hard baked patterned photoresist layer prior to forming the second doped region to reduce outgassing during implanting the second boron-containing species;
    forming a third doped region by implanting an arsenic-containing species into the semiconductor region through each opening of the patterned photoresist layer in a reduced energy tool; and
    thermally annealing the semiconductor.

2. The method of claim 1, wherein the second doped region is formed by implanting the second boron-containing species at an implant angle of about 9° or higher.

3. The method of claim 1, wherein the semiconductor region is a deep n-well region in an epitaxial layer of the semiconductor.

4. The method of claim 1, wherein the first doped region is formed using an energy of 300 KeV to about 600 KeV with a dose of about $1\times10^{12}$ cm$^{-2}$ to about $1\times10^{14}$ cm$^{-2}$ in an MeV tool.

5. The method of claim 4, wherein the second boron-containing species are the same; and the second doped region is formed using an energy of about 20 KeV to 200 KeV with a dose of about $1\times10^{13}$ cm$^{-2}$ to about $5\times10^{14}$ cm$^{-2}$ in a mid-current tool.

6. The method of claim 5, wherein the third doped region is formed following forming the second doped region and using an energy of about 120 KeV to about 200 KeV with a dose of about $1\times10^{13}$ cm$^{-2}$ to about $2\times10^{14}$ cm$^{-2}$ in the mid-current tool.

7. The method of claim 1, wherein the thermal annealing occurs at a temperature of about 800° C. or more.

8. A method for forming a laterally diffused metal oxide semiconductor (LDMOS) transistor, comprising:
- forming a deep n-well region in an epitaxial layer on a semiconductor substrate;
- forming a patterned photoresist layer over the deep n-well region, wherein the patterned photoresist layer is formed without hard baking;
- implanting a boron species into the deep n-well region through the non-hard baked patterned photoresist layer in a first implantation using an energy of 300 KeV or greater;
- following the first implantation, implanting the boron species into the deep n-well region through the non-hard baked patterned photoresist layer in a second implantation using an energy of 200 KeV or less and an implant angle of 12° or more; and
- forming a gate dielectric layer on the deep n-well region;
- whereby the energy of the first implantation functions to cure the non-hard baked patterned photoresist layer to reduce outgassing during the second implantation; and the implant angle of the second implantation functions to compensate an implant tail from the first implantation.

9. The method of claim 8, further comprising implanting an arsenic species into the deep n-well region through the patterned photoresist layer in a third implantation using an energy of 200 KeV or less.

10. The method of claim 8, further comprising forming isolation structures in the deep n-well region; wherein the isolation structures are STI (shallow trench isolation) structures or LOCOS (local oxidation of silicon) structures.

11. The method of claim 8, further comprising forming isolation structures in the deep n-well region prior to the first implantation of the boron species.

12. The method of claim 8, further comprising a thermal annealing process at a temperature of about 800° C. to about 1200° C. performed following the first and second implantations.

13. The method of claim 12, wherein the thermal annealing process is performed as part of a thermal oxidation process used to form isolation structures in the deep n-well.

* * * * *